United States Patent
Toda

(10) Patent No.: US 7,006,397 B2
(45) Date of Patent: *Feb. 28, 2006

(54) DATA WRITE CIRCUIT IN MEMORY SYSTEM AND DATA WRITE METHOD

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/964,904

(22) Filed: Oct. 14, 2004

(65) Prior Publication Data

US 2005/0047237 A1    Mar. 3, 2005

Related U.S. Application Data

(63) Continuation of application No. 10/437,256, filed on May 13, 2003, now Pat. No. 6,822,917.

(30) Foreign Application Priority Data

May 14, 2002    (JP)    ............................ 2002-138485

(51) Int. Cl.
*G11C 7/00*    (2006.01)
(52) U.S. Cl. ................ 365/205; 365/149; 365/189.11; 365/207
(58) Field of Classification Search ..................... None
See application file for complete search history.

(56) References Cited

U.S. PATENT DOCUMENTS

| | | | | |
|---|---|---|---|---|
| 4,870,617 A | * | 9/1989 | Nakano et al. ............. 365/190 |
| 4,980,863 A | * | 12/1990 | Ogihara ....................... 365/205 |
| 5,047,986 A | * | 9/1991 | Miyamoto et al. .......... 365/226 |
| 5,305,261 A | * | 4/1994 | Furutani et al. ........ 365/189.01 |
| 5,764,562 A | | 6/1998 | Hamamoto .................. 365/149 |
| 5,796,664 A | | 8/1998 | Tsuruda et al. ............. 365/200 |
| 5,805,508 A | | 9/1998 | Tobita .................... 365/189.09 |
| 5,973,991 A | | 10/1999 | Tsuchida et al. ............ 365/233 |
| 6,097,658 A | | 8/2000 | Satoh et al. ................. 365/222 |
| 6,285,578 B1 | * | 9/2001 | Huang ......................... 365/154 |
| 6,341,100 B1 | | 1/2002 | Fujioka ....................... 365/233 |
| 6,484,246 B1 | | 11/2002 | Tsuchida et al. ............ 711/189 |
| 6,822,917 B1 | * | 11/2004 | Toda ........................... 365/205 |

FOREIGN PATENT DOCUMENTS

JP    2001-101863    4/2001

* cited by examiner

*Primary Examiner*—Tan T. Nguyen
(74) *Attorney, Agent, or Firm*—Hogan & Hartson, L.L.P.

(57) ABSTRACT

There is disclosed a memory system including a memory cell array, a sense amplifier circuit, a write circuit, a level setting circuit, a column decoder, a data line, and a sense amplifier control circuit. The level setting circuit sets external input data to substantially the same level as a read potential difference level from the memory cell. The external input data whose level has been set by the level setting circuit is transferred to the sense amplifier selected by the column decoder via the data line. The sense amplifier control circuit activates the selected sense amplifier so as to write the external input data into the memory cell with substantially the same sequence as that at a data read time from the memory cell.

17 Claims, 7 Drawing Sheets

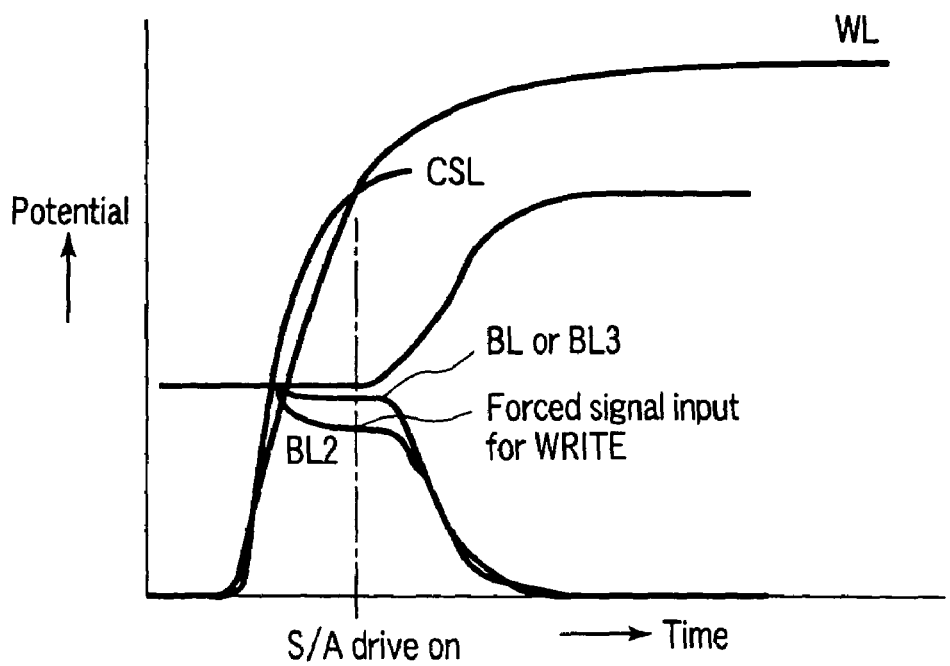
F I G. 10B

DATA WRITE CIRCUIT IN MEMORY SYSTEM AND DATA WRITE METHOD

This is a continuation of application Ser. No. 10/437,256, filed May 13, 2003 now U.S. Pat. No. 6,822,917, which application hereby incorporated by reference in its entirety.

CROSS-REFERENCE TO RELATED APPLICATIONS

This application is based upon and claims the benefit of priority from the prior Japanese Patent Application No. 2002-138485, filed May 14, 2002, the entire contents of which are incorporated herein by reference.

BACKGROUND OF THE INVENTION

1. Field of the Invention

The present invention relates to a memory system such as a DRAM which amplifies a low-level signal stored in a memory cell to read information, particularly to a data write circuit in the memory system, and a data write method.

2. Description of the Related Art

In a memory system such as DRAM, a low-level signal stored in a memory cell is amplified and information (data) is read. With an increase of the number of memory cells by a large capacity of a memory, a bit line capacitance as a node in which a sense amplifier senses data increases, and a capacitive coupling between bit lines increases. The increase of the bit line capacitance or capacitive coupling adversely affects a sense operation essential for high speed of a random cycle, and a peripheral operation. Examples of this adverse influence include a drop of sense speed or restore speed of the DRAM, and an increase of disturbance at a write time. The drop of speed and the increase of disturbance become obstacles in construction of a high-speed cycle memory system. Especially in recent years, the high-speed cycle memory system has increasingly played an important role for a relay system of data transfer in a network.

Next, the bit line capacitance, and the influence of the capacitance between the bit lines with respect to the sense operation will be described.

As shown in FIG. 1, a bit line pair BL2, /BL2 to be noticed, and bit line pairs BL1, /BL1 and BL3, /BL3 disposed on opposite sides of the pair will be considered. A bit-line capacitance Cb of the bit line pair BL2, /BL2 is represented by: Cb=C+Cbb, wherein Cbb denotes a coupling capacitance of the bit line pair BL2, /BL2 with the bit lines /BL1, BL3 (adjacent bit lines) disposed on the opposite sides of the pair, and C denotes another capacitance.

Here, data exists so that, for example, "0" is sensed in the noticed bit line pair BL2, /BL2. In this case, the bit line BL2 changes to a low potential level, and the bit line /BL2 changes to a high potential level. In the bit line pairs BL1, /BL1 and BL3, /BL3 disposed on the opposite sides of the noticed bit line pair BL2, /BL2, "1" or "0" is sensed/amplified.

At this time, FIG. 2A shows a state of an ideal potential change of the bit line pair BL2, /BL2 in a case in which the coupling is assumed not to exist. When a word line WL rises to a high potential level, data "0" of the memory cell is outputted onto the bit line BL2, and a sense operation is performed by a sense amplifier, the potential of the bit line BL2 largely changes to a power supply potential $V_{SS}$ from an intermediate potential, and the potential of the bit line /BL2 largely changes toward a power supply potential $V_{DD}$.

Moreover, the potential changes of the bit line pairs BL1, /BL1 and BL3, /BL3 disposed adjacent to the noticed bit line pair BL2, /BL2 are assumed as follows. The bit line BL1 changes to a low level, and the bit line /BL1 changes to a high level. The bit line BL3 changes to the low level, and the bit line /BL3 changes to the high level. Then, by a coupling capacitance Cbb, as shown in FIG. 2B, from the ideal state shown by a broken line, the potential changes of the bit line pair BL2, /BL2 are suppressed as shown by a solid line. Therefore, time is unnecessarily required until the bit line pair BL2, /BL2 reaches a sufficient restore level.

In this situation, when the capacitance can be replaced with an effective bit line capacitance Cbeff, and the adjacent bit lines /BL1, BL3 change in a direction reverse to the potential changes of the noticed bit line pair BL2, /BL2, an excess charge is further required by the coupling. As a result, the effective bit line capacitance Cbeff is represented by:

$$Cbeff=C+2Cbb=Cb+Cbb$$

That is, it follows that the bit line capacitance further increases by "Cbb".

When the data is read or restored from the memory cell, the bit line capacitance increases and an excess time is only required. However, when the data is written, there is possibility that an erroneous operation is caused.

FIG. 3 is a schematic explanatory view showing that "0" is written in the noticed bit line pair BL2, /BL2. In the adjacent bit line pairs BL1, /BL1 and BL3, /BL3, "1" or "0" is read, sensed, and refreshed. It is assumed that the bit line BL1 or BL3 changes to the low level, and the bit line /BL1 or /BL3 changes to the high level. At this time, assuming an ideal case in which there is not any coupling between the bit line pairs, the potentials of the adjacent bit line pairs BL1, /BL1 and BL3, /BL3 change as shown in FIG. 4A. That is, a low-level signal (potential) read from the memory cell is rapidly amplified at a timing tS in response to the operation of the sense amplifier, and stored information of the memory cell is refreshed.

On the other hand, when the capacitance between the bit lines is large; and there is the coupling of the potential change, the potential changes as shown in FIG. 4B. It is assumed that "0" is forcedly written in the noticed bit line pair BL2, /BL2 from the outside. At this time, the bit line /BL2 changes to the high level, and the bit line BL2 changes to the low level. In this case, when the data is transferred from the outside in a stage as early as possible, the write can be performed at a high speed.

However, when the data is transferred from the outside in this early stage, the micro read potentials from the memory cells in the adjacent bit line pairs BL1, /BL1 and BL3, /BL3 are reversed by the coupling. At a sense start time, the sense operation is performed at the potential generated by the coupling, not the read potential from the memory cell. As a result, an erroneous sense is caused with respect to the adjacent bit line pairs BL1, /BL1 and BL3, /BL3.

To solve the problem, when the sense operation of the adjacent bit line pairs BL1, /BL1 and BL3, /BL3 sufficiently proceeds, and the sense operation is not reversed any more by the coupling, the forced write needs to be performed with respect to the noticed bit line pair BL2, /BL2. However, in this case, the excess time is required for the write, and the data cannot be written, immediately after a word line WL is raised to the high level and the memory cell is selected.

Additionally, for data transfer via a high-speed network, it has increasingly become important to perform a random cycle at a high speed, and a system referred to as late write has been employed.

FIG. 5 is a schematic diagram showing an outline of specifications of the late write system. The DRAM includes cycles of write and read, and the order in which these cycles are generated is totally random. FIG. 5 shows these cycles along a time axis time, and address and data accessed at this time in each cycle are combined/shown. It is imaged that the data is taken into the memory by an arrow directed into a block at a write time, and it is imaged that the data is outputted from the memory by an arrow directed to the outside from the block at a read time.

In the late write operation, the taken data to be written is not transferred to the memory cell in the cycle, and the address and data are temporarily stored in a portion (register) other than the memory cell. In FIG. 5, an address Add1 and data Data1 are held in the register. The held address Add1 and data Data1 are transferred to the memory cell in a write cycle which soon comes next. In this manner, the address and data in the previous write cycle are transferred to the memory cell in the cycle at the present time. Since the address of a transfer destination is already known, the transfer operation can be started without waiting until the address inputted in this cycle is decided. Therefore, in principle, a write operation can be performed at the same cycle time as the read cycle time.

However, when the coupling between the bit line pairs is strong as described above, the erroneous operation of the adjacent bit line pair is caused. Therefore, the data transfer into the memory cell has to be retarded. Therefore, valuable advantages of the late write operation cannot effectively be used.

As one method of solving the problem, a method of only momentarily disconnecting the sense amplifier from the bit line at the sense operation time has been proposed. This method will be described with reference to FIGS. 6, 7A, and 7B.

As shown in FIG. 6, sense nodes S1, /S1, S2, /S2, S3, /S3 are constituted to be disconnected from bit line pairs BL1, /BL1, BL2, /BL2, BL3, /BL3 by switches SW1, /SW1, SW2, /SW2, SW3, /SW3, respectively. These switches SW1, /SW1, SW2, /SW2, SW3, /SW3 are opened (off state), when a control signal ISO has the low level. The sense nodes S1, /S1, S2, /S2, S3, /S3 are disconnected from the bit line pairs BL1, /BL1, BL2, /BL2, BL3, /BL3, respectively.

Here, "0" is forcedly written in the noticed bit line pair BL2, /BL2. The sense node S2 largely changes to the low level, and the sense node /S2 largely changes to the high level. Additionally, in the adjacent bit line pairs BL1, /BL1 and BL3, /BL3, the sense nodes /S1, /S3 change to the high level, and the sense nodes S1, S3 change to the low level. Such sensed and amplified situation is considered.

A sense situation of the adjacent bit line pairs BL1, /BL1 and BL3, /BL3 in a case in which there is no write is as shown in FIG. 7A. When the word line WL is raised at the high level, and the data of the memory cell is transmitted and set to the sense nodes S2, /S2 from the bit line pair BL2, /BL2, the control signal ISO is lowered at the low level, and the bit line pairs are disconnected from the sense amplifiers respectively. The sense amplifier is driven in this state, and the data is sensed and amplified. Moreover, when the data is amplified at a certain degree, the control signal ISO is raised at the high level, and the sense data is written back into the bit line pair. At this time, in the sense node /S1 or /S3, S1 or S3, the amplified level somewhat decreases. In the bit line pair BL1 or /BL3, BL1 or BL3, the level of the data of the memory cell is enlarged to the amplified level. Finally, both levels agree with each other and the data of the memory cell is restored.

The write into the noticed bit line pair BL2, /BL2 is further assumed in this operation as shown in FIG. 7B. While the control signal ISO is in the low level, that is, while the switch of the sense amplifier and bit line pair is off, the forced write is performed in the sense nodes S2, /S2 of the noticed bit line pair BL2, /BL2. Since a small coupling capacitance can be set between the amplified sense nodes of the sense amplifier, this forced write does not cause the sense erroneous operation of the amplified sense amplifier.

Therefore, the sense operation related with the adjacent bit line pairs proceeds in the same manner as in FIG. 7A. When the control signal ISO is raised at the high level, and the sense nodes S2, /S2 are connected to the bit line pairs BL2, /BL2, the noticed bit line pair changes to a forced write level, the adjacent bit line pairs change to a sense amplification level, and the write and refresh operation of the data are completed.

When the switch is disposed between the bit line pair and sense amplifier as described above, and even when the coupling between the bit line pairs is large, the data can forcedly be written at an earlier time, and features of specifications of the late write can be achieved.

However, even with this control, when the data is accessed at a high-speed cycle, it is difficult to take the timing of the control signal ISO. Also for the timing of the forced write, the data cannot be written until the data of the memory cell is sufficiently transferred to the sense node and set. A loss of timing is generated as shown by a waste time (WT) in FIG. 7B.

As described above, in the related-art memory system and data write method, with the increase of the number of memory cells by the large capacity of the memory, the bit line cycle and capacitive coupling increase, and the sense operation and peripheral operations essential for accelerating the random cycle are adversely affected.

Moreover, to transfer the data via the high-speed network, the system referred to as the late write is employed. However, when the coupling between the bit lines is strong, the erroneous operation of the adjacent bit line is caused. Therefore, the data transfer to the memory cell has to be delayed, and the valuable advantage of the late write cannot effectively be used.

As one method of solving the problem by the late write system, the method of only momentarily disconnecting the sense amplifier from the bit line at the sense operation time has been proposed. However, it is difficult to take the timing of the control signal. For the timing of the forced write, the data cannot be written until the data of the memory cell is sufficiently transferred to the sense node and set. The loss of timing is generated.

BRIEF SUMMARY OF THE INVENTION

According to one aspect of the present invention, there is provided a data sense method of a memory system comprising a read cycle and a write cycle, the read cycle including, (i) providing a readout potential difference to a sense amplifier by inputting information stored in a memory cell, in the sense amplifier, (ii) sensing and amplifying the readout potential difference at the sense amplifier, and (iii) outputting readout data of the memory cell from the sense amplifier, and the write cycle including: (i) setting external input data to substantially the same level as that of the readout potential difference, (ii) inputting the level-set external input data in the sense amplifier via a data line, (iii) sensing and amplifying the level-set external input data in substantially the same sequence as the read cycle, and (iv) writing the level-set external in the memory cell.

Moreover, according to another aspect of the present invention, there is provided a data sense method of a memory system comprising a read cycle and a write cycle, the read cycle including, (i) sensing and amplifying information stored in a memory cell, using a sense amplifier; and (ii) outputting readout data of the memory cell from the sense amplifier, and the write cycle including, (i) setting a level of an external input data, (ii) inputting the level-set data in the sense amplifier, and (iii) writing the level-set data in the memory cell by activating the sense amplifier.

Furthermore, according to another aspect of the present invention, there is provided a transferring information stored in a memory cell to a sense amplifier, the transferring being performed in a read cycle, activating the sense amplifier to which information stored in the memory cell has been transferred, outputting the information after sensing and amplifying the information using the sense amplifier, setting a level of an external input data, the setting being performed in a write cycle, transferring the level-set data to the sense amplifier, activating the sense amplifier to which the level-set data is transferred, and writing the level-set data in the memory cell, after sensing and amplifying the level-set data by the sense amplifier.

Furthermore, according to another aspect of the present invention, there is provided a data write method of a memory system which comprises a plurality of memory cells and in which an operation of accepting data from the outside and a transfer operation of the data into the memory cell are temporally independent, the method comprising: allowing a data read sense /restore operation from the memory cell and a data write store operation into the memory cell to substantially simultaneously proceed with respect to the different memory cells; and setting a transfer signal amount into a sense node to be sensed in the sense operation from the memory cell immediately before sensing the data to substantially the same level as that of the transfer signal amount of write data from a data acceptance portion into the sense node immediately before sensing the data to write the data.

BRIEF DESCRIPTION OF THE SEVERAL VIEWS OF THE DRAWING

FIG. 10B is an internal waveform diagram showing the timing of the column selection signal in the write cycle, and showing the write operation in the late write by the memory system according to the embodiment of the present invention.

DETAILED DESCRIPTION OF THE INVENTION

Figure 8:
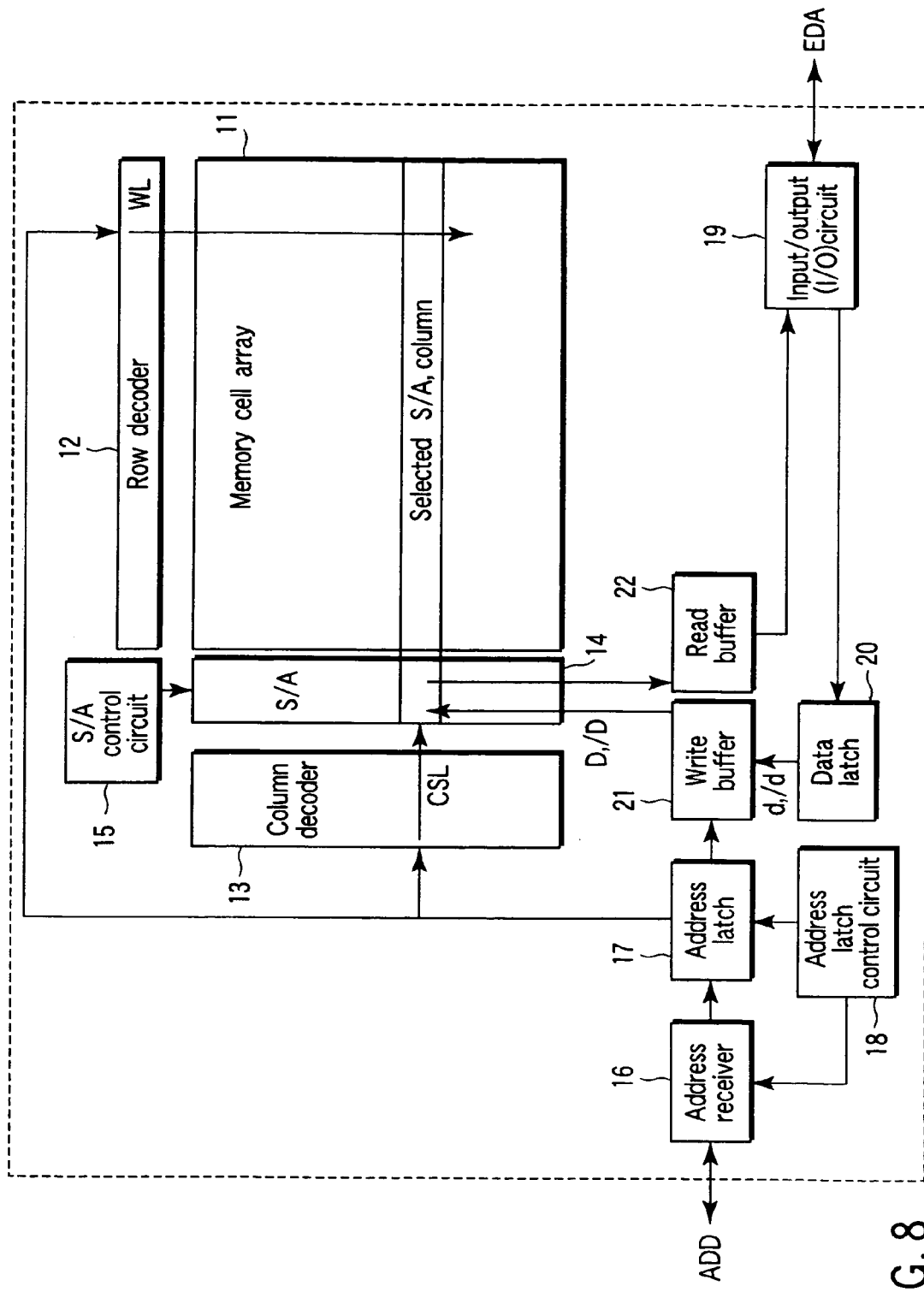
FIG. 8 is a block diagram showing the memory system and data write method according to an embodiment of the present invention, and showing a schematic constitution in which a main part of a semiconductor storage device is extracted.

FIG. 8 is a block diagram showing a memory system and data write method according to an embodiment of the present invention, and showing a schematic constitution in which a main part of a semiconductor storage device (DRAM) is extracted. The semiconductor storage device includes a memory cell array 11, a row decoder 12, a column decoder 13, a sense amplifier circuit (S/A) 14, a sense amplifier (S/A) control circuit 15, an address receiver 16, an address latch 17, an address latch control circuit 18, an input/output (I/O) circuit 19, a data latch 20, a write buffer 21; and a read buffer 22.

An address signal ADD is inputted into the address receiver 16, and latched in the address latch 17. The taking of this address signal ADD is controlled by the address latch control circuit 18. For the address signal ADD latched by the address latch 17, a row address is supplied and decoded in the row decoder 12. A column address is supplied and decoded in the column decoder 13. By a decoded output of the row decoder 12, the word line WL in the memory cell array 11 is selectively driven. A column selection signal CSL is outputted from the column decoder 13, and the sense amplifier (S/A) is selected, and the column of the memory cell array is selected. Accordingly, one memory cell in the memory cell array 11 is selected.

The data read from the selected memory cell is amplified by the sense amplifier circuit 14, and thereafter supplied and latched in the read buffer 22. The data latched in the read buffer 22 is outputted from the input/output circuit 19.

On the other hand, the write data (external input data EDA) inputted into the input/output circuit 19 is supplied to the data latch 20 and latched. The data latched by the data latch 20 is supplied to the bit line pair via input data line pair d, /d, write buffer 21, data line pair D, /D, and sense amplifier circuit 14. Moreover, the data is written in the memory cell schematic diagram by the row decoder 12 and column decoder 13.

Figure 9A:
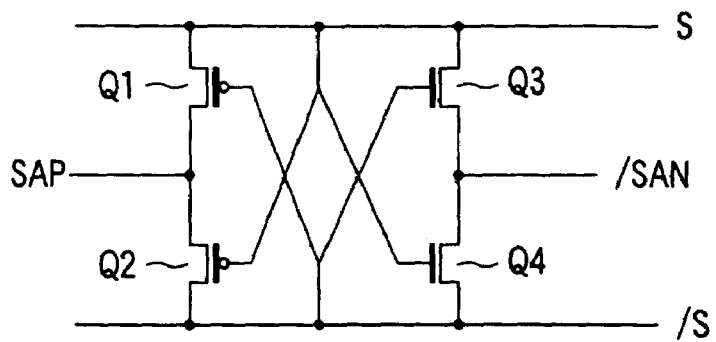
FIG. 9A is a circuit diagram showing a constitution example of each sense amplifier in a sense amplifier circuit in a circuit shown in FIG. 8.

FIG. 9A shows a constitution example of each sense amplifier in the sense amplifier circuit 14 in a circuit shown in FIG. 8. The sense amplifier is connected to each bit line pair, and constituted of P-channel type MOS transistors Q1, Q2 and N-channel type MOS transistors Q3, Q4. Current passages of the MOS transistors Q1, Q2 are connected in series to the sense nodes S, /S, a gate of the MOS transistor Q1 is connected to the sense node /S, and the gate of the MOS transistor Q2 is connected to the sense node S. The current paths of the MOS transistors Q3, Q4 are connected in series to the sense nodes S, /S, the gate of the MOS transistor Q3 is connected to the sense node /S, and the gate of the MOS transistor Q4 is connected to the sense node S. A sense amplifier driving signal SAP is supplied to a connection point between the current paths of the MOS transistors Q1, Q2 from the sense amplifier control circuit 15, and a sense amplifier driving signal /SAN is supplied to the connection point between the current paths of the MOS transistors Q3, Q4 from the sense amplifier control circuit 15. Moreover, the signal SAP which has been in an intermediate level changes to the high level, the signal /SAN which has been in the same intermediate level as that of the signal SAP changes to the low level, the sense amplifier is thereby activated, and a small potential difference between the sense nodes S and /S is sensed and amplified.

Figure 9B:
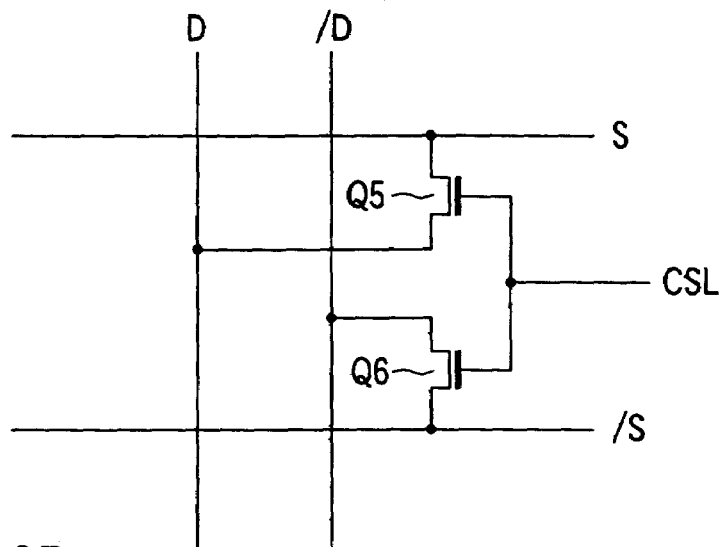
FIG. 9B is a circuit diagram showing a constitution example of a switch portion for connecting a sense node of the sense amplifier shown in FIG. 9A to a data line pair.

FIG. 9B shows a constitution example of a switch circuit for connecting the sense nodes S, /S of the sense amplifier shown in FIG. 9A to the data line pair (external data bus) D, /D, when the column selection signal CSL rises at the high level. This switch circuit is disposed between the sense amplifier circuit 14 and write buffer 21. The switch circuit is constituted of: an N-channel type MOS transistor (column selection transistor) Q5 whose current path is connected between the data line D and sense node S; and an N-channel type MOS transistor (column selection transistor) Q6 whose current path is connected between the data line /D and sense node /S. The column selection signal CSL is supplied to the gates of the MOS transistors Q5, Q6. Moreover, the external input data EDA is transferred to the bit line pair via the data line pair D, /D, the current paths of the MOS transistors Q5, Q6, and the sense nodes S, /S.

Figure 9C:
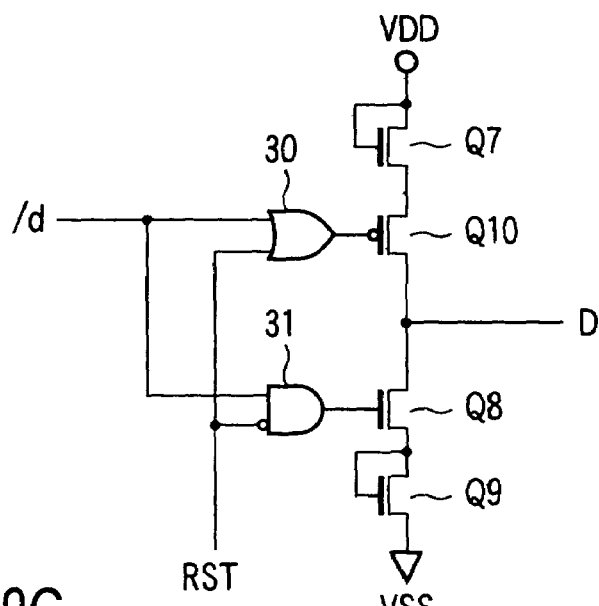
FIG. 9C is a circuit diagram showing a level setting circuit for setting a level of the data line pair in the switch portion shown in, FIG. 9B to a low-level signal.

FIG. 9C shows a level setting circuit for setting the levels of the data line pair D, /D in the switch circuit shown in FIG. 9B to a low-level signal. This level setting circuit is disposed for each of the data lines D, /D, and the data lines D, /D are set to the low-level signals having levels equal to those of the signals read into the bit line pair from the memory cell in accordance with the write data. This level setting circuit includes N-channel type MOS transistors Q7, Q8, Q9, a P-channel type MOS transistor Q10, an OR gate 30, and an AND gate 31. An input data line d (or /d) is connected to one input end of the OR gate 30 and AND gate 31. A reset signal RST is supplied to the other input end of the OR gate 30, and the reset signal RST is reversed and inputted into the other input end of the AND gate 31. An output end of the OR gate 30 is connected to the gate of the MOS transistor Q10, and the output end of the AND gate 31 is connected to the gate of the MOS transistor Q8. The current paths of the MOS transistors Q7, Q10, Q8, Q9 are connected in series between the power supplies $V_{DD}$ and $V_{SS}$. The gate of the MOS transistor Q7 is connected to the power supply $V_{DD}$, and the gate of the MOS transistor Q9 is connected to the connection point between the current paths of the MOS transistors Q8, Q9. Moreover, the connection point between the current paths of the MOS transistors Q10, Q8 is connected to the data line D (or /D).

The data lines D and /D are set to the intermediate level between the power supplies $V_{DD}$ and $V_{SS}$ by an intermediate potential generation circuit (not shown). The circuit shown in FIG. 9C is constituted to apply a bias to this intermediate level so that a micro potential change is generated.

In the setting corresponding to the input data "1", the MOS transistor Q10 on a power supply $V_{DD}$ side turns on, and is set to the potential lower than the power supply $V_{DD}$ by a threshold voltage of the MOS transistor Q7 inserted on the power supply $V_{DD}$ side. In the setting of the threshold voltage of the transistor Q7, the data line D (or /D) is not fully swung to the power supply. On the other hand, in the setting corresponding to the input data "0", the MOS transistor Q8 on the power supply $V_{SS}$ (ground) side turns on, and is set to the potential higher than the ground level by the threshold voltage of the MOS transistor Q9 inserted on the ground side. In the setting of the threshold voltage of the MOS transistor Q9, the data line D (or /D) is not fully swung to the ground level. The signal RST indicates the high level, when this level setting circuit is not used, and the input data into the input data line pair d, /d is prevented from being transmitted to the data line pair D, /D.

Figure 1:
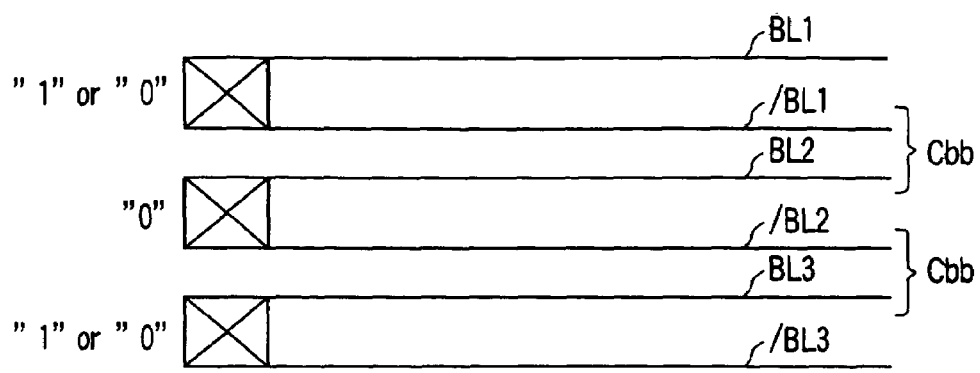
FIG. 1 is a schematic diagram showing a capacitive coupling between bit lines.
Figure 2A:
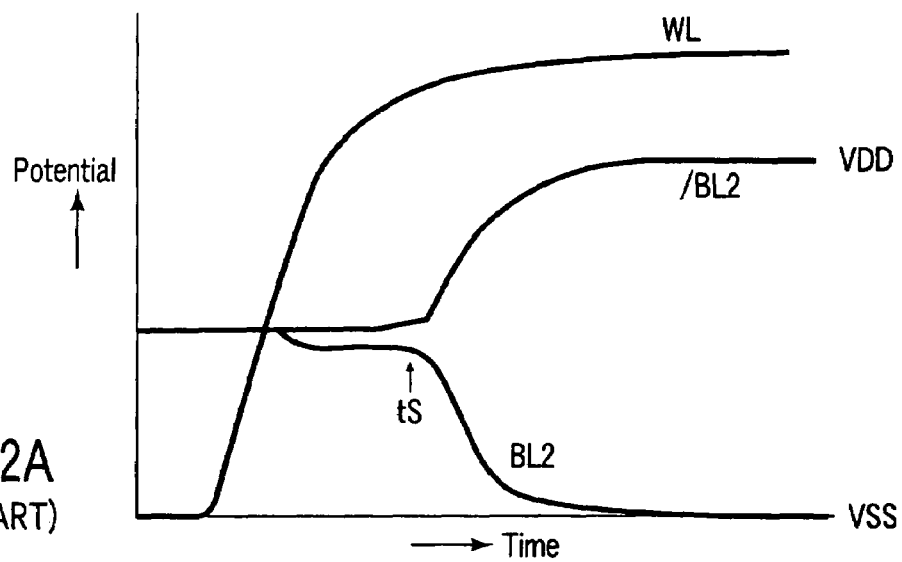
FIG. 2A is an internal waveform diagram showing the capacitive coupling between the bit lines and showing an ideal state of a potential change of a bit line pair assuming that there is no coupling.
Figure 2B:
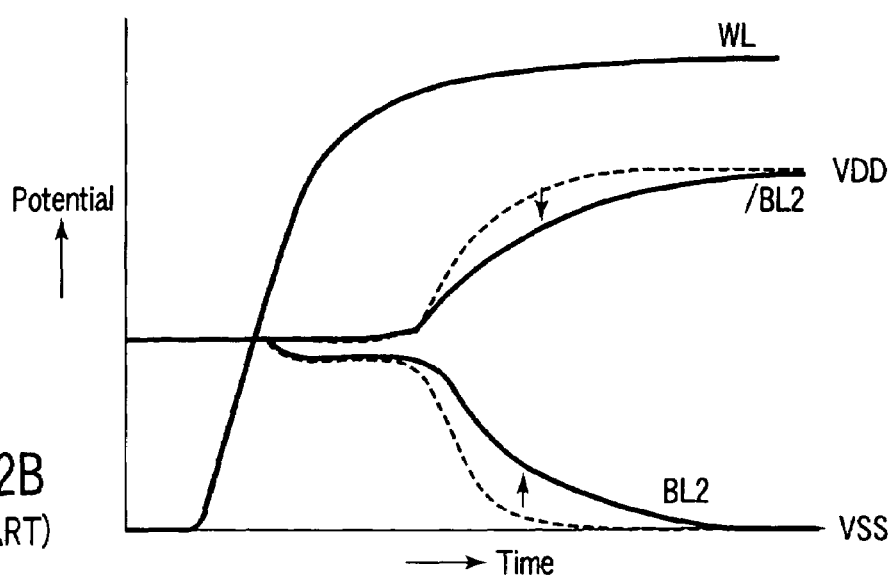
FIG. 2B is an internal waveform diagram showing the capacitive coupling between the bit lines and showing the state of the potential change of the bit line pair in a case in which there is the coupling.
Figure 3:
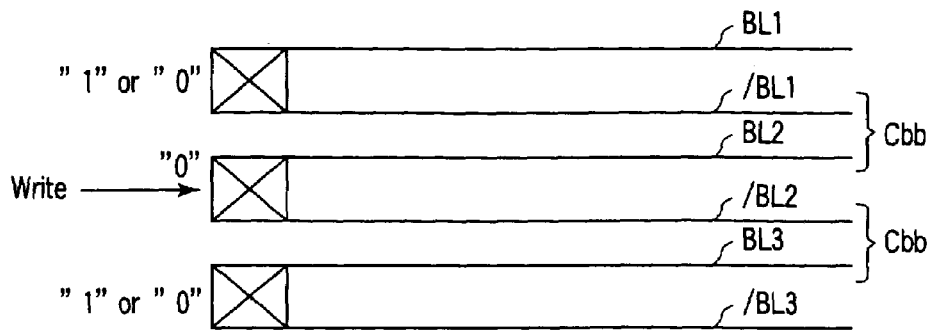
FIG. 3 is a schematic diagram showing the capacitive coupling between the bit lines at a write time.

Next, the operation in the above-described constitution will be described. First, a case is considered in which "0" is written in the noticed bit line in the same manner as in FIG. 3. With the related-art write cycle, after the address of the noticed bit line is decided, and the column is selected by the column selection signal CSL, the data starts to be written in the noticed bit line.

Figure 10A:
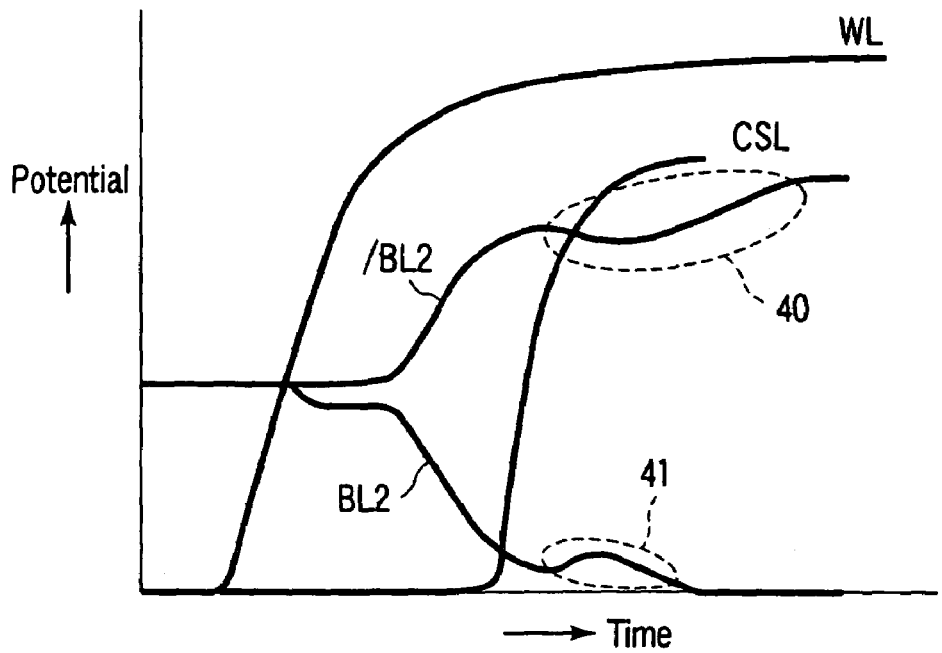
FIG. 10A is an internal waveform diagram showing a timing of a column selection signal in a write cycle, and showing a related-art timing of the column selection signal and a write operation.

FIGS. 10A and 10B show the timing of the column selection signal CSL in a related-art write cycle as contrasted with the timing and write operation state according to the embodiment of the present invention.

FIG. 10A shows rising of the related-art column selection signal CSL. When the row address is decided, the selected word line WL rises at the high level, the data of the memory cell is sufficiently outputted to the bit line pair BL2, /BL2, and the sense amplification of the sense amplifier proceeds to a certain degree, the column address for selecting the sense amplifier is defined. Accordingly, the column selection signal CSL rises at the high level, and the bit line pair BL2, /BL2 are connected to the data line pair (external data bus) D, /D. In the read, as surrounded with broken lines 40, 41 shown in FIG. 10A, the levels of the bit line pair BL2, /BL2 fluctuate because of turbulence from the outside at this time. In the write, at this time, the force write is performed, and the sense amplifier and bit line pair are set to the levels corresponding to the write data. When the sense proceeds in this state, there is no possibility of the erroneous operation by the coupling between the bit lines, but the operation speed is largely delayed.

Figure 4A:
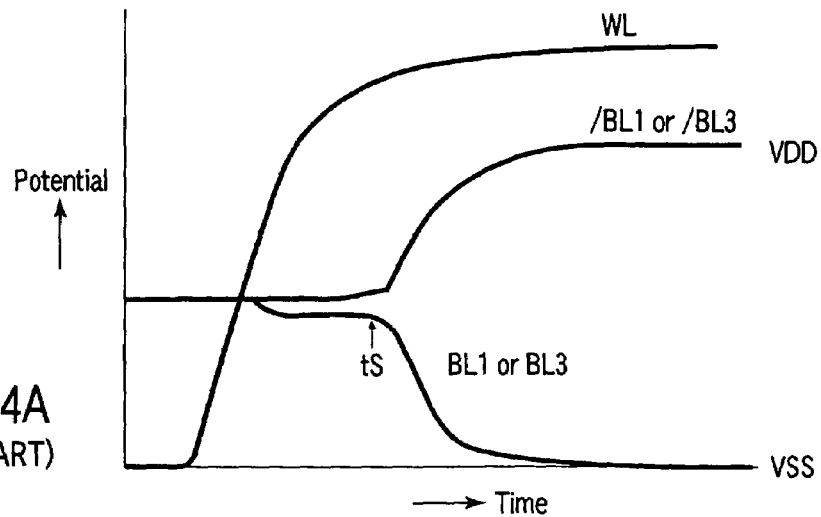
FIG. 4A is an internal waveform diagram showing the potential change of the adjacent bit line pair in an ideal case in which there is no coupling between the bit lines.
Figure 4B:
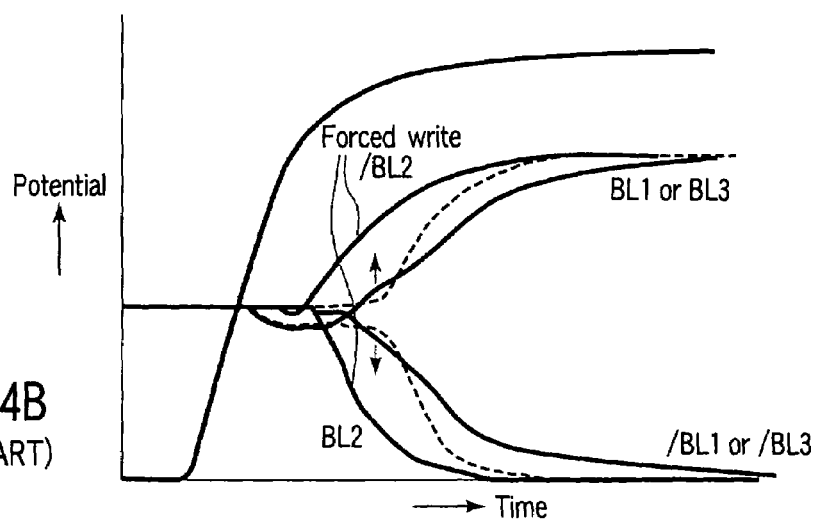
FIG. 4B is an internal waveform diagram showing the potential change of the adjacent bit line pair in a case in which the capacitance between the bit lines is large and there is the coupling of the potential change.
Figure 5:
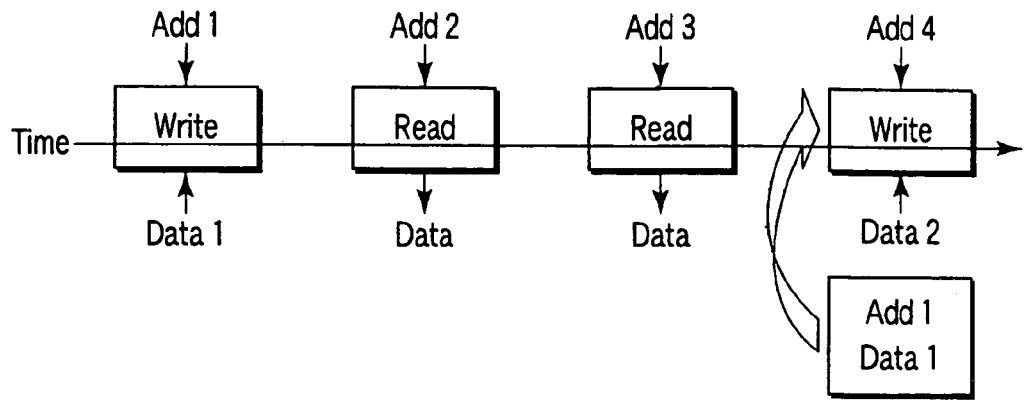
FIG. 5 is a schematic diagram showing an outline of late write specifications in a related-art memory system.
Figure 6:
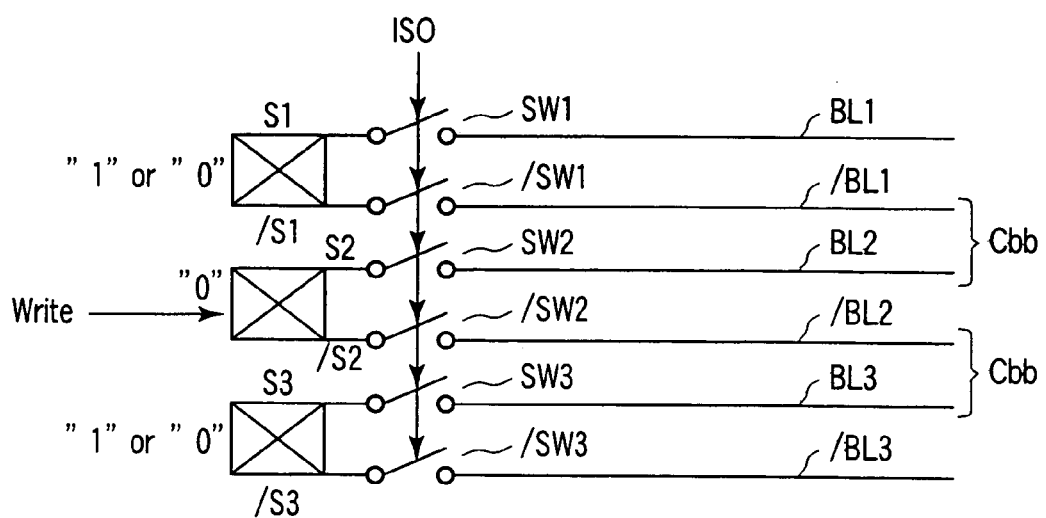
FIG. 6 is a schematic diagram showing the related-art memory system and data write method for solving a problem of the late write.
Figure 7A:
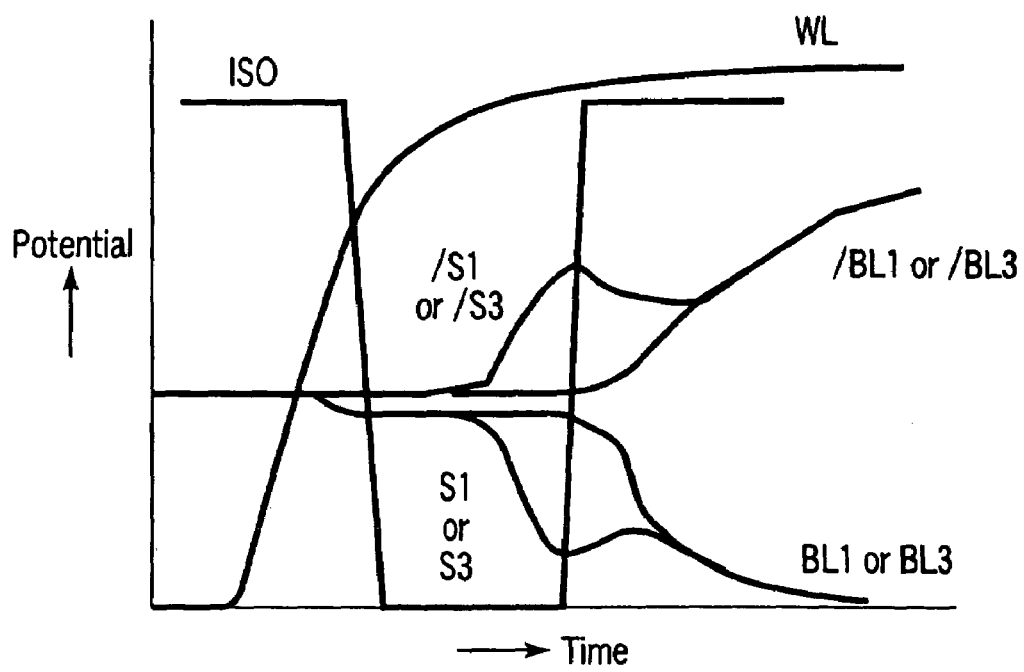
FIG. 7A is an internal waveform diagram showing a situation of sense of an adjacent bit line in a case in which there is no write.
Figure 7B:
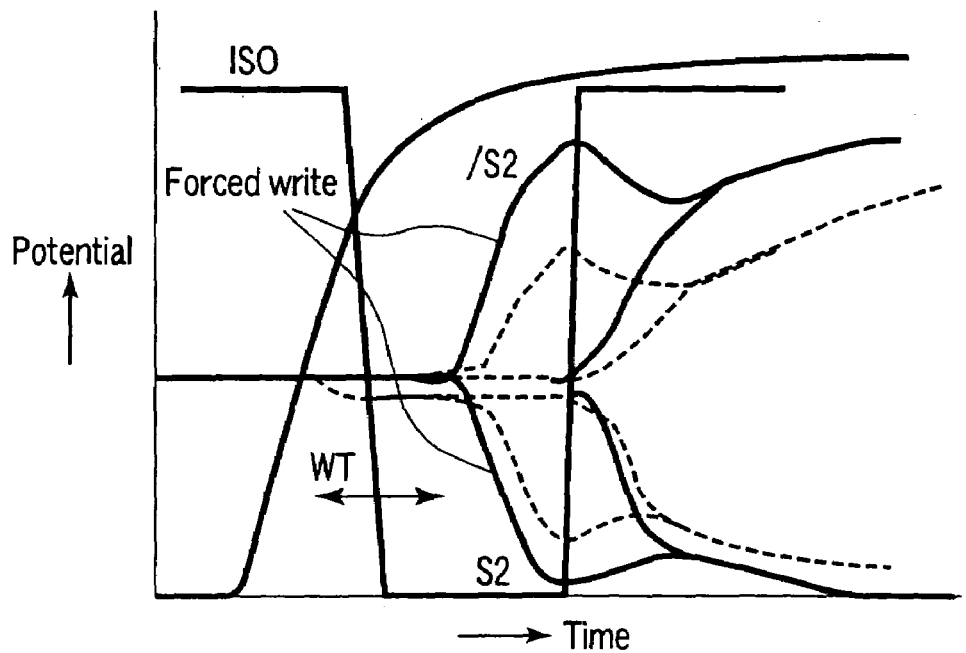
FIG. 7B is an internal waveform diagram in which the write of a noticed bit line is further assumed in an operation shown in FIG. 7A.

On the other hand, in the write operation in the late write by the memory system according to the embodiment of the present invention, the state is as shown in FIG. 10B. In the late write, as described with reference to FIG. 5, the address and data are defined before the write cycle starts. Therefore, immediately after the write cycle starts, the word line WL and the column selection signal CSL for selecting the noticed column can be raised at the high level. When the word line WL is raised at the high level, a small potential difference signal corresponding to information (data) stored in the bit line pair is outputted from the memory cell. However, since the noticed column selected by the column selection signal CSL is connected to the data line pair D, /D and the bit line pair, it is not guaranteed that this small potential difference corresponds to the data of the memory cell. At this time, when a large signal is supplied from the data line pair D, /D, a large potential difference is generated in the noticed bit line pair. When the coupling between the bit lines is large, the information of the adjacent bit line is also destroyed. This has been described with reference to FIG. 4B.

To solve the problem, the small potential difference corresponding to predefined write data is supplied to the data line pair D, /D. This potential difference is set such that substantially the same potential difference as that generated in the bit line pair is generated by the data read from the memory cell. This cancels the potential difference of the cell information generated by redistribution of charges of the bit line capacitance and cell capacitance from the memory cell, and the small potential difference corresponding to the external input data EDA is generated in the bit line pair, particularly in the sense node. FIG. 10B shows that the size of a forced signal input for WRITE from the outside is about twice that of the signal read from the memory cell. However, the signal may be of any level, as long as the sense amplifier can sense/amplify the signal. Moreover, when the write operation into the memory cell and the external input data EDA are defined (the timing at which S/A drive on is indicated), the sense amplifier is activated, and the sense/amplify operation is performed.

In this case, the sense operation can similarly be performed regardless of the write or the read/refresh from the memory cell. A cycle time longer than that of the read cycle is not required in the write cycle.

Therefore, according to one aspect of the present invention, even when the capacitive coupling between the bit lines for transferring the data to the sense amplifier from the memory cell is large, the data write cycle time using the late write specifications can be set to be equal to the read cycle time, and the DRAM of the high-speed random cycle can be realized.

Thereafter, when the miniaturization of the semiconductor storage device further proceeds, a ratio of the capacitive coupling in the memory cell array apparently increases, and an effect is great in realizing the high-speed cycle.

It is to be noted that in the above-described embodiment, the DRAM has been described as the example. However, of course any memory system can also be applied to another memory, as long as the low-level signal stored in the memory cell is amplified and the information (data) is read.

As described above, according to one aspect of this invention, in the constitution and method, the sense operation from the sense amplifier can be performed without distinguishing the operations in reading the data from the memory cell and in writing the data. Moreover, since the sense amplifier can be set so as to realize the high-speed operation optimum for reading and restoring the data from the memory cell, the high-speed random cycle can easily be realized, for example, in the DRAM.

Therefore, even when the capacitive coupling between the bit lines is large, the memory system and data write method can be obtained so as to accelerate the write operation of the data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A data sense method of a memory system comprising a read cycle and a write cycle,
    the read cycle including: (i) providing a readout potential difference to a sense amplifier by inputting information stored in a memory cell, in the sense amplifier; (ii) sensing and amplifying the readout potential difference at the sense amplifier; and (iii) outputting readout data of the memory cell from the sense amplifier; and
    the write cycle including: (i) setting external input data to substantially the same level as that of the readout potential difference; (ii) inputting the level-set external input data in the sense amplifier via a data line; (iii) sensing and amplifying the level-set external input data in substantially the same sequence as the read cycle; and (iv) writing the level-set external in the memory cell.

2. The data sense method according to claim 1, wherein the read cycle further includes, after sensing and amplifying the readout potential difference using the sense amplifier, transferring the readout potential difference, which is sensed and amplified using the sense amplifier, to the memory cell.

3. The data sense method according to claim 1, wherein a potential difference, corresponding in level to the readout potential difference, is generated inside the memory system by setting the external input data to substantially the same level as that of the readout potential difference.

4. The data sense method according to claim 3, wherein the potential difference, corresponding in level to the readout potential difference, is generated by shifting a power supply potential by a threshold voltage of a transistor connected to the data line.

5. The data sense method according to claim 1, wherein the external input data is data fetched in a previous write cycle and kept until a current write cycle.

6. A data sense method of a memory system comprising a read cycle and a write cycle, the read cycle including: (i) sensing and amplifying information stored in a memory cell, using a sense amplifier; and (ii) outputting readout data of the memory cell from the sense amplifier, and
    the write cycle including: (i) setting a level of an external input data; (ii) inputting the level-set data in the sense amplifier; and (iii) writing the level-set data in the memory cell by activating the sense amplifier.

7. The data sense method according to claim 6, wherein the read cycle further includes, after sensing and amplifying the information using the sense amplifier, transferring the information, which is sensed and amplified using the sense amplifier, to the memory cell.

8. The data sense method according to claim 6, wherein setting a level of the external input data includes setting a potential difference to correspond in level to a potential difference that is sensed and amplified by the sense amplifier.

9. The data sense method according to claim 8, wherein the potential difference, corresponding in level to a potential difference that is sensed and amplified by the sense amplifier, is generated inside the memory system.

10. The data sense method according to claim 9, wherein the potential difference is generated by shifting a power supply potential by a threshold voltage of a transistor connected to a data line.

11. The data sense method according to claim 6, wherein the external input data is data fetched in a previous write cycle and kept until a current write cycle.

12. A data sense method of a memory system comprising:
transferring information stored in a memory cell to a sense amplifier, the transferring being performed in a read cycle;
activating the sense amplifier to which information stored in the memory cell has been transferred;
outputting the information after sensing and amplifying the information using the sense amplifier;
setting a level of an external input data, the setting being performed in a write cycle;
transferring the level-set data to the sense amplifier;
activating the sense amplifier to which the level-set data is transferred; and
writing the level-set data in the memory cell, after sensing and amplifying the level-set data by the sense amplifier.

13. The data sense method according to claim 12, further comprising, after sensing and amplifying the information stored in the memory cell using the sense amplifier, transferring the information, which is sensed and amplified using the sense amplifier, to the memory cell.

14. The data sense method according to claim 12, wherein setting a level of the external input data includes setting the external input data to substantially the same level as that of a potential difference transferred from the memory cell to the sense amplifier.

15. The data sense method according to claim 14, wherein a potential difference, corresponding in level to a potential difference transferred from the memory cell to the sense amplifier, is generated in the memory system.

16. The data sense method according to claim 15, wherein the potential difference is generated by shifting a power supply potential by a threshold voltage of a transistor connected to a data line.

17. The data sense method according to claim 12, wherein the external input data is data fetched in a previous write cycle and kept until a current write cycle.

* * * * *